United States Patent [19]

Inouye et al.

[11] 4,232,926

[45] Nov. 11, 1980

[54] LOCKING MECHANISM FOR COUPLING AND UNCOUPLING ELECTRICAL CONNECTORS

[75] Inventors: Hiromasa Inouye, Mushashino; Matsuo Kato; Hiroaki Ito, both of Mooka, all of Japan

[73] Assignee: Bunker Ramo Corporation, Oak Brook, Ill.

[21] Appl. No.: 961,318

[22] Filed: Nov. 16, 1978

[30] Foreign Application Priority Data

Nov. 21, 1977 [JP] Japan .......................... 52-155340[U]

[51] Int. Cl.³ ........................................... H01R 13/62
[52] U.S. Cl. ............................................... 339/45 M
[58] Field of Search ................. 339/45 R, 45 M, 91 R

[56] References Cited

U.S. PATENT DOCUMENTS

| 3,311,863 | 3/1967 | Beale | 339/45 M |
| 3,784,954 | 1/1974 | Grimm et al. | 339/45 M |

FOREIGN PATENT DOCUMENTS

| 2812901 | 8/1978 | Fed. Rep. of Germany | 339/45 M |
| 53-28892 | 3/1978 | Japan | 339/45 M |

OTHER PUBLICATIONS

IBM Bulletin; Logic Card Retainer & Extractor, Barnes et al., 1976-08, vol. 19, No. 3, pp. 975-976.

*Primary Examiner*—Joseph H. McGlynn
*Attorney, Agent, or Firm*—F. M. Arbuckle; John R. Hoffman

[57] ABSTRACT

This invention relates to a locking mechanism for coupling anduncoupling electrical connectors. In the prior art, because of the large number of electrical contacts contained within the male and female connector parts, the insertion and extraction forces for coupling and uncoupling the connector parts are often sufficiently high to damage the supports for the connector parts. This is especially true with printed circuit boards wherein the insertion and extraction forces are applied normal to the flat surface of the board. The present invention overcomes this deficiency by providing an improved locking mechanism for coupling together and uncoupling mating electrical connector parts. One connector part is provided with an actuator pivotally mounted for applying force in both an insertion and an extraction direction as the actuator pivots. A projection on the other electrical connector part receives the insertion and extraction forces for coupling and uncoupling the connector parts, respectively. The actuator is also provided with a latch member which cooperates with a locking piece on the second connector part for latching the two connector parts together when the actuator is pivoted in the insertion direction until the connector parts are fully coupled together.

10 Claims, 10 Drawing Figures

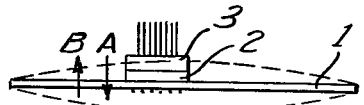
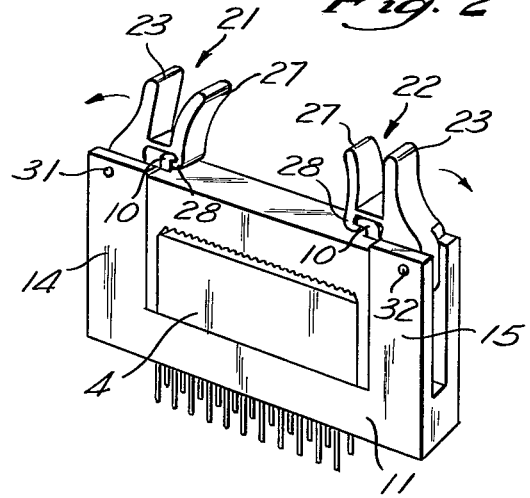
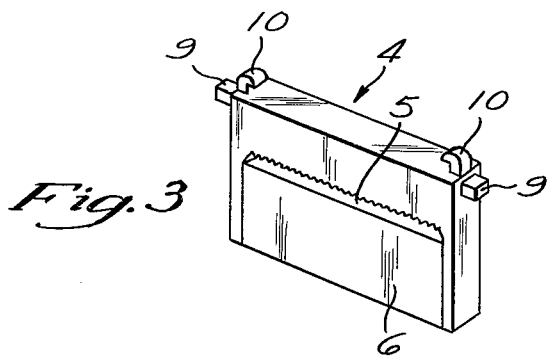
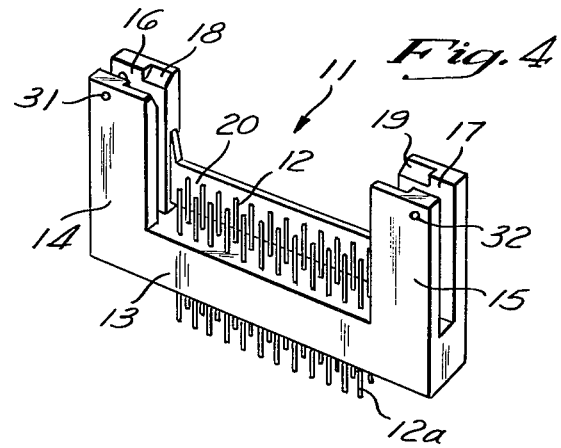
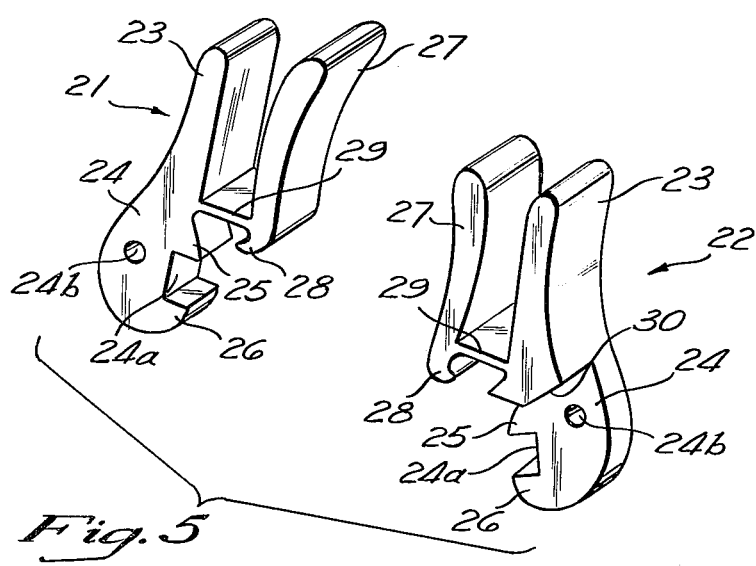

LOCKING MECHANISM FOR COUPLING AND UNCOUPLING ELECTRICAL CONNECTORS

TECHNICAL FIELD

This invention relates to the field of electrical connectors, and in particular to a locking mechanism for securely coupling together a pair of mated electrical connectors, and for uncoupling the connector parts, the coupling and uncoupling being accomplished without the application of damaging forces to either connector part or to the apparatus upon which the connector parts are mounted.

BACKGROUND OF THE PRIOR ART

For a large size printed circuit board, a number of connectors with multiple contacts are typically secured to the board to make connection with external circuitry. Some of the multi-electrode connectors require great insertion and removal forces for coupling and uncoupling, respectively, the two mating electrical connectors. The large forces are a result of the summation of forces of a large plurality of electrical contacts.

Consequently, in applications, where the coupling and uncoupling of the male and female connector parts is accomplished by directing the insertion and extraction forces normal to the plane of the printed circuit board, the excessive insertion and extraction forces cause the printed circuit board to bend and perhaps break or damage contacts and electrical components on the board.

BRIEF SUMMARY OF THE INVENTION

It is therefore an object of the present invention to provide an improved apparatus for coupling and uncoupling mating electrical connector parts without damaging the printed circuit board. Such an improved apparatus would also be useful when attempting to couple and uncouple connector parts at the ends of cables where great strength is required to overcome the insertion and extraction resistive forces. In accordance with the invention there is provided an improved locking mechanism for coupling together and uncoupling mating electrical connector parts. One connector part is provided with an actuator pivotally mounted for applying force in both an insertion and an extraction direction as the actuator pivots. A projection on the other electrical connector part receives the insertion and extraction forces for coupling and uncoupling the connector parts, respectively. The actuator is also provided with a latch member which cooperates with a locking piece on the second connector part for latching the two connector parts together when the actuator is pivoted in the insertion direction until the connector parts are fully coupled together. Thus, the present invention can serve to couple and uncouple the connector parts with smaller manually applied forces and without damaging the printed circuit board. Yet, the invention offers a coupling and uncoupling mechanism that is secure and which can lock the connector parts into firm latched engagement thereby not only preventing damage to the printed circuit board but preventing the connector parts from becoming disengaged by vibration and other outside forces. As a result, the reliability of the connection made is exceptionally good.

The locking mechanism according to the invention is comprised of at least one actuator pivotally mounted on a first connector part and which cooperates with an engageable means on the second connector part. The actuator has means for applying force in both an insertion and an extraction direction as the actuator pivots, the insertion and extraction forces being directed against the engageable means on the second connector part.

The actuator also includes a latch member which is shaped to latch with a locking means on the second connector part when the actuator is pivoted in the insertion direction until the connector parts are fully coupled together.

The actuator has a notch therein with sidewalls defining the means for applying insertion and extraction forces. The second connector part has an outwardly extending projection defining the engageable means, the projection being engageable by the sidewalls of the notch for effecting relatively movement between the first and second connector parts as the actuator pivots.

The latch member is hook-shaped and is resiliently attached to the actuator by a flexible connecting piece. On the same end of the flexible connecting piece as the latch member is an operating tab which is movable by the users finger for releasing the latch member from the locking means. The actuator has a second operating tab on the main body thereof which is used by the user to apply insertion force to the actuator.

In a preferred embodiment, the first connector part has a pair of actuators, one on each side of an opening in the first connector part. The opening receives the second connector part which has a pair of locking means extending therefrom, one adjacent each end of its rear wall.

When the two connector parts are brought together but not yet fully coupled, the projection of the second connector part enters the notch in the actuator, and the locking piece of the second connector part is positioned below and inwardly of the position of the latch member on the actuator. In this condition, the insertion tabs of the opposed actuators are pressed toward one another, and one of the sidewalls of the notch in each actuator presses against the engageable projection on either side of the second connector part to force the two connector parts toward one another, i.e. toward a coupled state.

At the same time, the hooked portion of the latch member on the actuator is brought further inwardly until it snap fits over the hooked locking piece of the second connector part to establish a firm engaged state in which the two connector parts are fully coupled. If the release tabs attached to the latch member are now pressed away from each other, i.e. outwardly, the flexible connecting piece permits the hooked portion of the latch member to disengage from the hooked locking means to release the engagement therebetween, and at the same time the opposite wall of the notch in the actuator applies a force in the extracting direction against the projection extending from the second connector part.

Thus, as a result of the mechanical advantage developed by the lever action of the actuators, a small amount of manually applied force in the direction to pull the actuators toward one another serves to couple the connector parts together, and when coupled to securely latch them in the coupled state, while a force applied to the actuators in a direction to separate them releases the latched engagement of the latch member with the locking piece and subsequently applies a relatively high extraction force to the engageable projections to uncouple the connector parts. In this manner, any large forces applied by the user are against the pivot means for the actuator and the sides of the connector parts and not against the printed circuit board upon which the connector is mounted.

BRIEF DESCRIPTION OF THE DRAWINGS

The improved locking mechanism for coupling and uncoupling electrical connector parts will now be described in detail with reference to the accompanying drawings in which:

FIG. 1 shows a prior art connector assembly which indicates the result of applying insertion and extraction forces to couple and uncouple the connector parts;

FIG. 2 shows a preferred embodiment of the invention in which male and female connector parts are in a fully coupled and latched condition, using the apparatus of the present invention;

FIG. 3 is a perspective view of one of the connector parts according to the invention;

FIG. 4 is a perspective view of a mating contact without its actuators in place and for mating with the connector part shown in FIG. 3;

FIG. 5 shows a pair of actuators not assembled in their connector housing in order to show the construction details thereof;

DETAILED DESCRIPTION OF THE INVENTION

Figure 6:
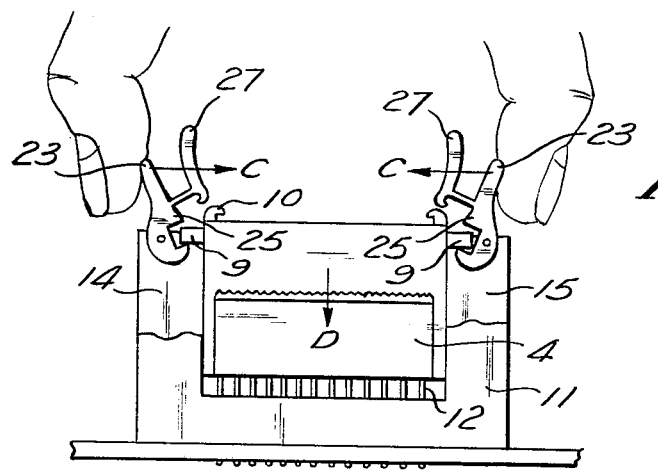
FIG. 6 is an elevational view showing the connector parts in loose engagement.

In FIG. 1 there is shown, schematically, a prior art arrangement of printed circuit board 1 and fixed and removable mating connector parts 2 and 3, the coupling together of the two connector parts being accomplished by forcing the removable connector part 3 in the direction of arrow A, and the uncoupling of the connector parts being accomplished by applying a release force to the removable connector part 3 in the direction of arrow B. It can be appreciated that, for a large size printed circuit board containing a large plurality of electrical contacts, great strength for coupling and uncoupling is required due to the summation of the individual contact frictional forces. Therefore, for example as shown in FIG. 1, if the fixed male connector part 2 is secured with its contacts at a right angle to the plane of the printed circuit board 1, and a removable female connector part 3 is to be inserted for connection, the insertion of the female connector 3 exerts a large force on the printed circuit board in the direction of arrow A, and when it is pulled out, a large force is applied in the direction of arrow B. Consequently, the printed circuit board 1 may bend as indicated by the dotted lines shown in FIG. 1, and this could result in loose connections, broken circuit path on the printed circuit board, damage to electrical components on the printed circuit board, or even cracking of the printed circuit board itself. There is therefore a need for an improved connector to remedy this problem.

The present invention can be used to couple and uncouple the connector parts with a relatively smaller operating force than that required for direct coupling and uncoupling and without any substantial flexing of the printed circuit board. Yet, the invention offers a coupling/uncoupling mechanism that locks the connector parts into firm engagement which not only prevents damage to the printed circuit board but prevents the connector parts from becoming disengaged by vibration and other outside forces due to the high reliability of the connection.

FIG. 2 shows a complete assembly of two connector parts 4 and 11 with the coupling and uncoupling actuators generally shown at 21 and 22. For the purposes of this discussion, connector part 4 which is removable is shown as a female connector, and connector part 11 which is fixed to the printed circuit board is shown as a male connector. However, it should be understood that either connector part 4 or 11 can be male or female. In FIG. 2, the connectors 4 and 11 are shown in the fully coupled state with the coupling/uncoupling actuators 21 and 22 in a fully latched condition.

FIGS. 3-5 show the disassembled parts which make up the complete male and female connector part assembly. In the Figures, the removable connector part 4 has an insulation block 6 for supporting a plurality of female electrical contacts, and a cable insertion passage 5 is provided to receive a flat cable to be connected with the female contacts of the insulation block 6. An engageable projection 9 protrudes from each side of the connector part 4 for receiving insertion and extraction forces. A pair of locking pieces 10 are located adjacent the ends of the top wall of the connector part 4. The projections 9 extend outwardly and at a right angle to the direction of coupling and uncoupling with the fixed connector part 11. The locking members 10 are formed with bent tips facing one another and directed substantially parallel to the top wall of the removable connector 4.

The fixed connector part 11, as best seen in FIG. 4, has male contacts 12, a connecting terminal 12a, a contact support insulating block 13, and a pair of spaced support legs 14 and 15 which serve the dual purpose of a guide for insertion of the removable connector part and support for the coupling/uncoupling actuators 21 and 22. The support legs 14 and 15 are integral with the insulating block 13 and extend parallel to one another and at a right angle to the insulating block 13. The guides for insertion and extraction of the removable connector part 4 are shown as slots 16 and 17 which also serve to pivotally mount the coupling/uncoupling actuators 21 and 22 as will be discussed later.

The tips of the support legs are beveled at 18 and 19 for positively guiding the projections 9 on the removable connector part 4.

A reinforcing wall 20 is provided at one side of the fixed connector part 11 in order to add rigidity to the support legs 14 and 15.

Referring back to FIG. 2, the coupling/uncoupling actuators 21 and 22 are preferably made of an elastic material such as plastic resin materials and consist of the parts shown in FIG. 5. In the latter Figure, a rounded main body portion 24 has an upwardly extending insertion tab 23. The body portion 24 is narrower than the insertion tab portion 23 and is sized to rotate freely within the slots 16 and 17.

A notch 24a is provided in the body portion 24, the notch having side walls defined by projections 25 and 26 for operative engagement with engageable projection 9 on the female connector 4.

A release tab 27 having a latch member 28 integrally formed at its bottom end is resiliently coupled to the main body portion 24 by a flexible connecting web 29. The tip of the latch member has a hooked portion which cooperates with the locking piece 10 when the male and female connectors are fully coupled together. At the transition between the thinned portion 24 and the thicker portion 23 of the actuators 21, 22, a stop shoulder 30 is formed to limit the rotational position of the actuator when moved in an extraction direction.

Mounting pins 31 and 32 extend across the slots 16 and 17, respectively, and are received in apertures 24b for pivotally supporting the actuators 21 and 22 on the support legs 14 and 15 of fixed connector part 11.

Figure 7:
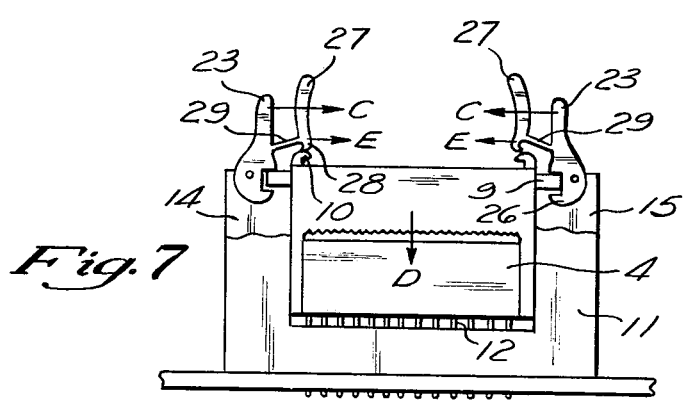
FIG. 7 is an elevational view showing the two connector parts in partial engagement.
Figure 10:
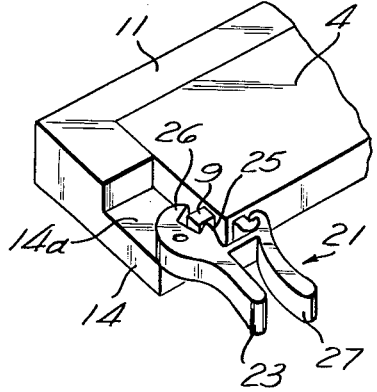
FIG. 10 is a partial perspective view showing the details of the actuator and the second connector part in a fully coupled and latched condition according to an alternate embodiment of the invention.

FIGS. 6 through 9 seve to explain the manner of coupling and uncoupling the pair of electrical connector part 4 and 11. When inserting the removable connector 4, its contacts are loosely engaged with the contacts 12 of the fixed connector part 11 in the absence of any coupling forces. Then, with the thumb and index finger of one hand, the insertion tabs 23 of actuators 21 and 22 are simultaneously pulled toward one another, i.e. in the direction of arrow C shown in FIG. 6. Consequently, the engageable projection 9 on the removable connector part 4 is pushed by the projection 25, and the removable connector part 4 moves in the direction of arrow D, so that, as shown in FIG. 7, the degree of coupling between connector parts becomes greater. In FIG. 7, the removable connector part 4 is approximately half-way coupled with the fixed connector part 11. In this position of the connector parts 4 and 11, the latch members 28 slide over the respectives locking pieces 10 of the removable connector part 4 in the direction of arrows E shown in FIG. 7.

Figure 8:
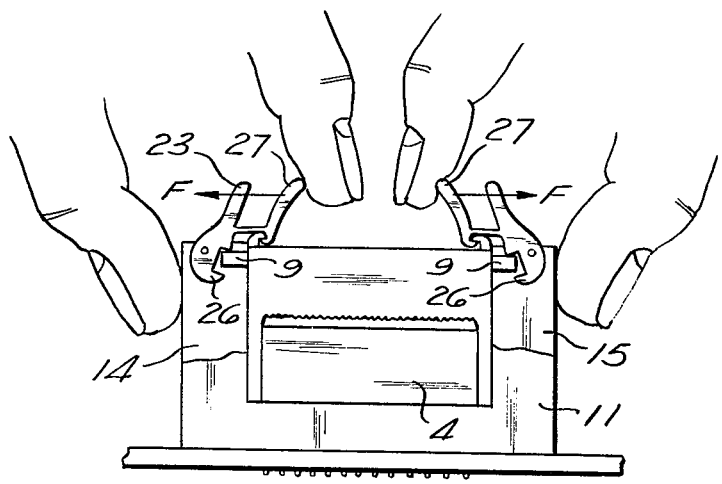
FIG. 8 is an elevational view showing the two conector parts fully coupled together and in a latched condition.

Owing to the bending of the flexible connecting web 29, the latch members 28 continue to slide over the tips of locking pieces 10 until they snap downward and assume the positions shown in FIGS. 2 and 8, when the coupling of connector parts 4 and 11 is completed. In this condition, the tips of the latch members 28 fall into a latched condition with locking pieces 10 of the removable connector part 4 to securely maintain the coupled state.

Figure 9:
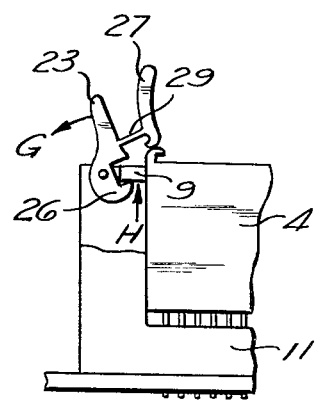
FIG. 9 is a partial elevational view showing the condition of the locking mechanism just after the application of an extraction force.

When extracting the removable connector part 4, as shown in FIGS. 8 and 9, the index fingers of both hands are placed on the inner side of the release tabs 27 of actuators 21 and 22, with the thumbs braced against the sides of support legs 14 and 15, respectively, of the fixed connector part 11. The release tabs 27 are thus pushed in the direction of arrows F (FIG. 8) which forces the flexible connecting webs 29 to bend, thereby allowing the latch members 28 to become disengaged from locking pieces 10, and positions the notch 24a so that the side walls thereof apply upward extracting forces against engageable projections 9. As the release tabs 27 are pushed further apart and rotated in the direction of arrow G, FIG. 9 the actuators 21 and 22 pivot to engage projections 26 with the bottom surfaces of engageable projections 9 to cause extractive upward movement of removable connector part 4 in the direction of arrow H in FIG. 9. Upon extraction of the removable connector part 4, the stop shoulders 30 (see FIG. 5) hit the upper surfaces of the support legs 14 and 15 and prevent the actuators 21 and 22 from opening further, thereby making the next insertion of the removable connector part 4 easier.

As explained to this point, with the present invention, if the fixed connector part is to be mounted on a printed circuit board and oriented with its male terminals 12 normal to the surface of the printed circuit board, the force for insertion and extraction of the removable part 4 is applied to the actuators 21 and 22, so that the component of the force toward the printed circuit board is very small, thereby alleviating the possibility of bending the printed circuit board at the time of insertion and extraction. Furthermore, with the present invention, the insertion and extraction are performed by utilizing leverage advantage that is determined by the ratio between the length of the insertion and release tabs 23 and 27 and the distance from the mounting pins 31 and 32 to the points of contact between the sidewalls of notch 24a and the engageable projection 9. As a result, the actual force applied by the user is considerably lower than that required to effectuate direct insertion and extraction of the removable connector part.

This principle is also of advantage when the connector is to be installed in a tight place and sufficient force is difficult to apply for insertion and extraction, since the present invention permits the application of sufficient insertion and extraction forces in a relatively awkward position.

As mentioned earlier, although in the above explanation of a preferred embodiment of the invention a removable female connector is being inserted or extracted from a fixed male connector, the reverse can also be realized. Furthermore, in the above examples, the connectors were described as being coupled in a direction perpendicular to the flat surface of the printed circuit board. However, the principles of the invention can be applied in the situation where the terminals for the contacts of either male or female connectors are bent at right angles to the contact section on the printed circuit board to provide an insertion and extraction direction parallel to the board surface. In this case, the removable connector part would not be able to slide into the slots 16 and 17 from above. Consequently, one of the walls of each slot 16 and 17 must be cut off along the supporting legs 14 and 15, and actuators 21 and 22 pinned to the remaining wall of the slots so as to accommodate the engageable projections 9 within the notch 24a for insertion and extraction of the removable connector. Depending on the connector's shape, various other configurations can be made.

As is apparent from the foregoing explanation, with the present invention it is possible to insert and extract connectors with a minimum of force such that the printed circuit board or other mounting structure will not be bent or damaged, and by locking the connector parts in the coupled condition accidental disconnection because of vibration or external pulling forces can be prevented. Further, from the foregoing, it can readily be realized that this invention can assume various embodiments. Thus, it is to be understood that the invention is not limited to the specific embodiments described herein, but is limited only by the appended claims.

We claim:

1. A locking mechanism for coupling together and uncoupling first and second electrical connector parts, comprising: at least one actuator pivotally mounted on said first connector part and having a means for applying force in both an insertion and an extractive direction as said actuator pivots, said actuator further including a latch member; at least one engageable means on said second connector part cooperating with said force applying means of said actuator to receive said force in both an insertion and an extraction direction; and a locking means on said second connector part remote from said engageable means for latching with said latch member when said actuator is pivoted in said insertion direction and said connector parts are fully coupled to hold said first and second connector parts coupled together.

2. The locking mechanism as claimed in claim 1, wherein: said actuator has a notch therein with sidewalls defining said means for applying force; and said second connector part has an outwardly extending projection defining said engageable means, said projection being engageable by said sidewalls of said notch for effecting relative movement between said first and second connector parts as said actuator pivots.

3. The locking mechanism as claimed in claim 1, wherein: said first connector part has a pair of said actuators, one on each side of an opening in said first connector part, said opening receiving said second connector part; and said second connector part has a pair of said locking means extending therefrom, one adjacent each end of a rear wall of said second connector part.

4. The locking mechanism as claimed in claim 3, wherein: each of said actuators has a latch member; and said second connector part has a pair of said locking means, one adjacent each end of said rear wall of said second connector part.

5. The locking mechanism as claimed in claim 3, wherein said first connector part has a main body portion for housing a plurality of electrical contacts, and a pair of spaced support legs extending from said main body portion and defining said opening.

6. The locking mechanism as claimed in claim 5, wherein each of said support legs has a slot therein and a pin extending across said slot, each of said actuators being pivotally mounted partially within a respective slot about a respective pin.

7. A locking mechanism for coupling together and uncoupling first and second electrical connector parts, comprising: at least one actuator pivotally mounted on said first connector part and having a means for applying force in both an insertion and an extraction direction as said actuator pivots, said actuator further including a latch member; at least one engagable means on said second connector part cooperating with said actuator to receive said force in both an insertion and an extraction direction; and a locking means on said second connector part for latching with said latch member when said actuator is pivoted in said insertion direction until said connector parts are fully coupled together; said latch member comprising a hooked portion resiliently attached to said actuator; and said locking means comprising a fixed complementary hooked portion over which said resiliently attached hooked portion snap fits when said connector parts are fully coupled together.

8. The locking mechanism as claimed in claim 7, wherein said actuator has an insertion tab extending away from said first connector part for receiving an externally applied force to pivot said actuator in an insertion direction.

9. The locking mechanism as claimed in claim 7, wherein: said actuator has a flexible connecting web extending between said means for applying force and said latch member; and said actuator includes a release tab projecting from said latch member and away from said first connector part for receiving an externally applied force to release said latch member from engagement with said locking means and to pivot said actuator in an extraction direction.

10. A locking mechanism for coupling together and uncoupling first and second electrical connector parts, comprising: a pair of actuators pivotally mounted on said first connector part and having respective means for applying force in both an insertion and an extractive direction as said actuators pivot, said actuators further including respective latch members; engagable means on said second connector part cooperating with said actuators to receive said force in both an insertion and an extraction direction; and a locking means on said second connector part for latching with said latch members when said actuators are pivoted in said insertion direction until said connector parts are fully coupled together; said pair of actuators being located one on each side of an opening in said first connector part, said opening receiving said second connector part; and said second connector part having a pair of said locking means extending therefrom, one adjacent each end of a top wall of said second connector part; said first connector part having a main body portin for housing a plurality of electrical contacts, and a pair of spaced support legs extending from said main body portion and defining said opening; each actuator having a relatively thinned portion and a relatively thick portion, said thinned portion being contained within said slot, and the interface between the thinned and thick portions defining a shoulder which acts as a stop against the end of said support leg to limit the movement of said actuator when pivoting in the extraction direction.

* * * * *